Inventor
JOHN H. ALEXANDER
By Isidore Togut
Attorney 3,526,555

METHOD OF MASKING A SEMICONDUCTOR WITH A LIFTABLE METALLIC LAYER

John Henry Alexander, Harlow, England, assignor to International Standard Electric Corporation, New York, N.Y., a corporation of Delaware Filed May 31, 1967, Ser. No. 642,404
Claims priority, application Great Britain, July 15, 1966, 31,890/66
Int. Cl. H01l 7/00
U.S. Cl. 156—17 1 Claim

ABSTRACT OF THE DISCLOSURE

A technique for selectively disposing a film on a substrate by relief deposition, wherein a liftable material is deposited in accordance with the desired pattern and the film to be masked is deposited by the glow discharge process on the entire surface of the substrate. The liftable material is separated from the substrate by ultrasonic agitation in a liquid, the liquid gaining access to said material through the relatively porous glow-discharge-deposited film; the liftable material so separated removes the overlying portions of the deposited film from the substrate. This technique is especially useful in conjunction with films of silicon nitride and silicon oxide where the liftable material may be gold, copper or silver.

BACKGROUND OF THE INVENTION

Figure 1A:
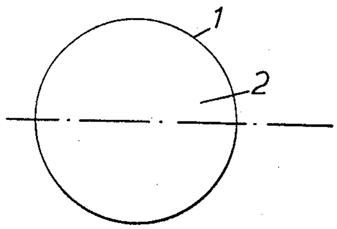

This invention relates to a method of masking the surface of a substrate to provide thereon discrete areas of a deposited film.

In vapor phase deposition processes it is difficult to deposit a film onto the surface of a substrate in discrete areas due to the non-rectilinear nature of the deposition. Masking is difficult since the substrate is usually heated, and to be effective the mask must remain in very close contact with the substrate.

Normally, masking difficulties are alleviated by use of photoetching techniques after the deposition process to produce the discrete areas. However, when the deposition process is carried out by, e.g., the glow discharge process, some of the deposited films are etch resistant. In the glow discharge process, the material to be deposited is in vapor form and mixed if necessary with a carrier gas, the mixture being decomposed and recombined at the surface of the substrate. Decomposition and recombination is effected by a gas plasma (initiated by radio frequency induction) or other electric discharge.

Another masking method is that commonly known as relief deposition. The general principles of the relief deposition technique are described, e.g., in U.S. Pat. No. 2,999,034.

An object of the present invention is to provide an alternative method for masking the surface of a substrate, which is especially suitable for achieving selective deposition of etch-resistant films.

SUMMARY

The present invention provides a relief deposition method of masking the surface of a substrate to provide thereon discrete areas of a deposited film, which includes the steps of evaporating a metallic layer onto the surface of the substrate such that only the discrete areas are exposed, depositing said film onto said discrete areas and said evaporated layer, and removing said evaporated layer and the deposited film contiguous therewith, for example by ultrasonic agitation in a suitable liquid.

IN THE DRAWING

FIGS. 1 to 4 illustrate in plan and sectional side views the various stages of the method of masking the surface of a substrate according to the invention.

DETAILED DESCRIPTION

Figure 1B:
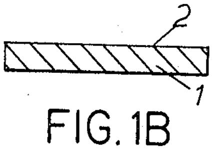

Referring to FIGS. 1A and 1B, a plan view and sectional side view of a substrate 1 is shown; it is desired to deposit discrete areas of an etch resistant film onto the surface 2. The film may comprise, e.g., silicon nitride or silicon oxide.

Figure 2A:
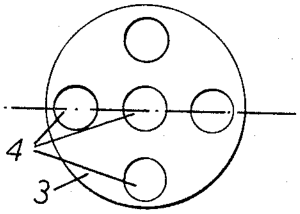
Figure 2B:
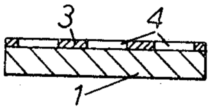

A layer 3 comprising a metal selected from Group 1–B of the Periodic Table, i.e. copper, gold, or silver is first evaporated onto the surface 2 of the substrate 1 such that only the discrete substrate areas 4 are exposed, as shown in FIGS. 2A and 2B of the drawing.

Figure 3A:
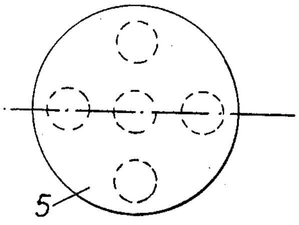
Figure 3B:
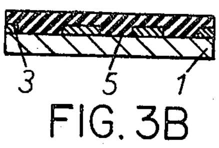
Figures 4A, 4B:
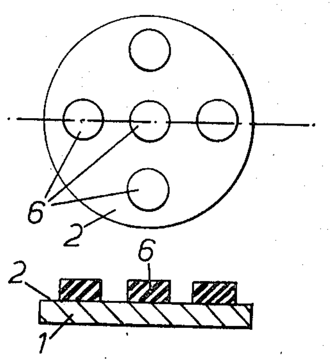

A film 5 is then deposited by, e.g., the well known glow discharge process (as described in copending application Ser. No. 452,487, filed May 3, 1965 and assigned to the assignee of the instant application) onto the discrete areas 4 and the evaporated layer 3 as shown in FIGS. 3A and 3B. When the deposited film 5 is of silicon nitride or silicon oxide and is deposited by the glow discharge process on top of the evaporated layer 3 of one of the metals selected from Group 1–B of the Periodic Table, the deposited film will be porous (due to the fact that the Group 1–B metals do not easily form nitrides, resulting in a weak chemical bond). When the substrate 1 is of silicon the bond between the metal layer 3 and the substrate 1 is considerably weakened. In fact, the bond is so weak that ultrasonic agitation in water is sufficient to remove the evaporated metal layer 3 and the deposited film 5 which is contiguous therewith to leave only the discrete areas 6 of the deposited film 5 on the surface 2 of the substrate 1 as shown in FIGS. 4A and 4B.

If any of the evaporated metal remains on the surface 2 of the substrate 1, this remainder may be removed by using a weak acid.

When substrates are used which do not give rise to a weakening of the bond between the evaporated layer 3 and the substrate 1 after the glow discharge deposition process, the evaporated layer 3 which in this instance must be of either copper or silver and the deposited film 5 which is contiguous therewith may be removed by ultrasonic agitation in a weak acid, e.g., 0.01 normal nitric acid. The weak acid removes the evaporated layer 3, access to said layer being provided by the porous nature of the deposited film 5, and the deposited film 5 is then removed by ultrasonic agitation.

While the principles of the invention have been described above in connection with specific embodiments, and particular modifications thereof, it is to be clearly understood that this description is made only by way of example and not as a limitation on the scope of the invention.

I claim:

1. A process for masking the surface of a silicon substrate with a film comprising a substance selected from a group consisting of silicon nitride and silicon oxide, said film being deposited in accordance with a predetermined pattern, comprising the steps of:

forming a metallic layer on a portion of the surface of said substrate, the remaining portion of said substrate being exposed in accordance with said predetermined pattern, said layer comprising a substrate selected from a group consisting of copper, gold and silver;

depositing said film from a glow discharge over said layer and the exposed portions of said substrate; and lifting off said layer and the overlying parts of said film by subjecting said layer to ultrasonic agitation in a liquid bath comprising a substance selected from a group consisting of water and diluted nitric acid, and leaving the remaining parts of said film on said substrate in accordance with said predetermined pattern.

References Cited

UNITED STATES PATENTS 3,012,920 12/1961 Christensen et al. ---- 156—11

JACOB H. STEINBERG, Primary Examiner

U.S. Cl. X.R.

156—11